United States Patent
Sahandiesfanjani

(10) Patent No.: US 6,970,123 B1
(45) Date of Patent: Nov. 29, 2005

(54) INDUCTORLESS ARCHITECTURE FOR A SWITCHING AMPLIFIER

(75) Inventor: Farzad Sahandiesfanjani, Santa Clara, CA (US)

(73) Assignee: Tripath Technology, Inc., San Jose, CA (US)

(*) Notice: Subject to any disclaimer, the term of this patent is extended or adjusted under 35 U.S.C. 154(b) by 0 days.

(21) Appl. No.: 11/004,396

(22) Filed: Dec. 2, 2004

(51) Int. Cl.$^7$ .............................................. H03M 1/12
(52) U.S. Cl. ...................................... 341/155; 341/143
(58) Field of Search ............................... 341/155, 156, 341/157; 330/252, 253, 255, 258; 326/21, 326/26, 30, 34, 56, 83; 327/108

(56) References Cited

U.S. PATENT DOCUMENTS

| | | | |
|---|---|---|---|
| 5,077,539 A | 12/1991 | Howatt | 330/10 |
| 5,243,229 A * | 9/1993 | Gabara et al. | 307/98 |
| 5,430,749 A * | 7/1995 | Horie | 372/38.02 |
| 5,608,352 A * | 3/1997 | Itakura | 330/253 |
| 5,777,512 A | 7/1998 | Tripathi et al. | 330/207 A |
| 5,974,089 A | 10/1999 | Tripathi et al. | 375/247 |
| 6,211,728 B1 | 4/2001 | Chen et al. | 330/110 |
| 6,262,632 B1 | 7/2001 | Corsi et al. | 330/251 |
| 6,292,014 B1 * | 9/2001 | Hedberg | 326/30 |

* cited by examiner

Primary Examiner—Brian Young
(74) Attorney, Agent, or Firm—Beyer Weaver & Thomas LLP

(57) ABSTRACT

A switching circuit for generating first and second output signals for differentially driving a load is described. The switching circuit is operable to enforce a minimum pulse width on each of the first and second output signals. The second output signal substantially corresponds to an inverted version of the first output signal delayed by a delay time substantially corresponding to the minimum pulse width.

21 Claims, 3 Drawing Sheets

INDUCTORLESS ARCHITECTURE FOR A SWITCHING AMPLIFIER

BACKGROUND OF THE INVENTION

The present invention relates to switching amplifiers and more specifically to techniques which enable inductorless switching amplifier architectures. Still more specifically, some embodiments of the invention relate to such architectures which employ sigma-delta modulation.

Switching amplifier and regulator architectures typically employ output filters to remove switching power from the output signal before it is applied to the load. That is, such architectures often switch at frequencies which are much higher than the frequency of interest. For example, in audio applications, switching amplifiers typically switch at 800 kHz or above as compared to the upper end of the frequency band of interest, i.e., 20 kHz. Without a suitable output filter, the energy of the switching frequency would be dissipated in the load. However as is well known, such output filters typically include external inductors and capacitors which are expensive and consume undesirable amounts of space.

Some solutions have been proposed in which output filters may be eliminated by reducing the switching power dissipated in the load. However, these solutions have been limited to pulse-width modulation applications in which the output frequency (and therefore the beginning of each successive pulse) is fixed. None of these solutions are suitable for switching topologies in which the output frequency varies, e.g., sigma-delta modulators.

It is therefore desirable to provide additional switching amplifier and regulator architectures which do not require output filters.

SUMMARY OF THE INVENTION

According to the present invention, a switching amplifier architecture is provided which does not require output filters. According to a specific embodiment, a switching circuit is provided which includes circuitry for generating first and second output signals for differentially driving a load. The circuitry is operable to enforce a minimum pulse width on each of the first and second output signals. The second output signal substantially corresponds to an inverted version of the first output signal delayed by a delay time substantially corresponding to the minimum pulse width.

According to another specific embodiment, a switching circuit is provided which includes analog processing circuitry operable to receive an analog input signal and generate a processed analog signal. Analog-to-digital conversion circuitry is operable to convert the processed analog signal to a first digital signal. Digital processing circuitry is operable to convert the first digital signal to first and second power stage drive signals. The digital processing circuitry is further operable to enforce a minimum pulse width on the first and second power stage drive signals. Power stage circuitry is operable drive a load differentially with first and second output signals in response to the power stage drive signals. The digital processing circuitry is operable to generate the first and second power stage drive signals such that the second output signal substantially corresponds to an inverted version of the first output signal delayed by a delay time substantially corresponding to the minimum pulse width.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Figure 1:
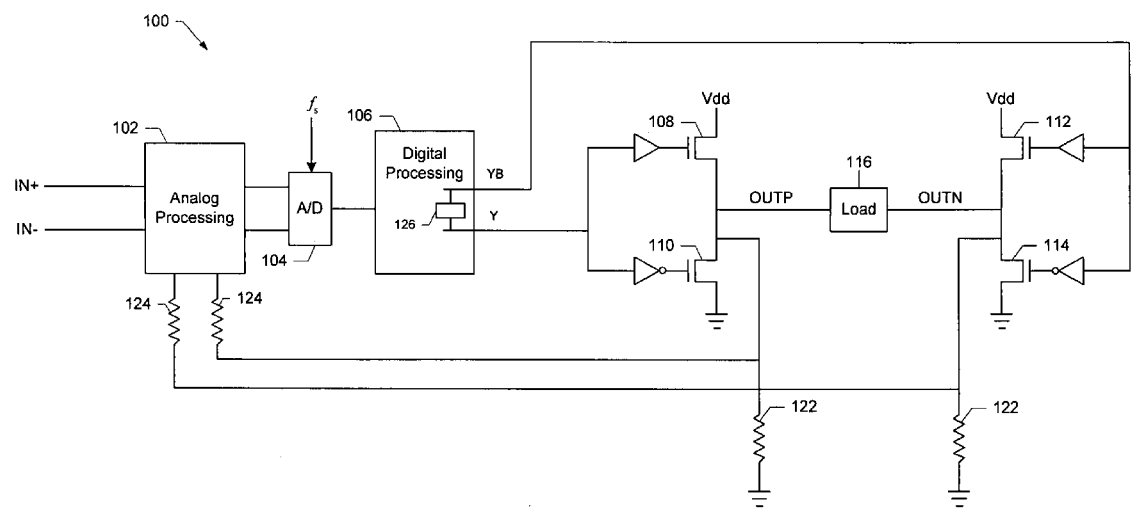
FIG. 1 is a block diagram of an exemplary switching amplifier architecture for use with various embodiments of the invention.

FIG. 1 is a simplified block diagram of a switching amplifier topology which may be employed to implement various embodiments of the invention. For the purpose of discussion, amplifier 100 is assumed to be a modified sigma-delta modulator configured for audio applications. An exemplary modified sigma-delta architecture which may be employed with such embodiments is described in U.S. Pat. No. 5,777,512 for METHOD AND APPARATUS FOR OVERSAMPLED, NOISE-SHAPING, MIXED-SIGNAL PROCESSING issued Jul. 7, 1998, the entire disclosure of which is incorporated herein by reference for all purposes. However, it should be understood that the techniques described herein may be employed with a wide variety of amplifier and regulator architectures including, but not limited to those employing some form of sigma-delta modulation.

Amplifier 100 includes an analog processing block 102 which receives a differential analog input signal on inputs IN+ and IN− and, in one implementation, processes the input signal with one or more integrator stages. The output of analog processing block 102 is converted to digital form with A/D converter 104 according to a sampling frequency $f_s$. A/D converter 104 may comprise, for example, a comparator which generates a 1-bit representation of the processed analog signal. Digital processing block 106 generates two drive signals Y and YB from the 1-bit digital input. Complementary versions of each drive signal are then applied to the gates of output FETs 108–114 which differentially drive load 116 with output signals OUTP and OUTN. Continuous-time feedback is provided to analog processing block 102 via feedback resistors 122 and 124.

Digital processing block 106 is operable to enforce a minimum pulse width at the amplifier output. Such a functionality may be employed to improve an amplifier's dynamic range as described in U.S. Pat. No. 5,974,089 for METHOD AND APPARATUS FOR PERFORMANCE IMPROVEMENT BY QUALIFYING PULSES IN AN OVERSAMPLED NOISE-SHAPING SIGNAL PROCESSOR issued on Oct. 26, 1999, the entire disclosure of which is incorporated herein by reference for all purposes. It should be noted that the amplifier topologies described in this referenced patent and the details associated with pulse qualification functionality associated therewith are merely exemplary and should not be used to limit the scope of the invention.

Regardless of the amplifier topology, the nature of the mechanism by which the minimum pulse widths are enforced, or the rationale for introducing such a constraint, switching architectures implemented with a minimum pulse width enforcement mechanism may take advantage of this constraint according to the invention to reduce the output power delivered to the load, and therefore reduce or eliminate the need for conventional output filtering. This may be understood with reference to FIGS. 2 and 3.

Figure 2:
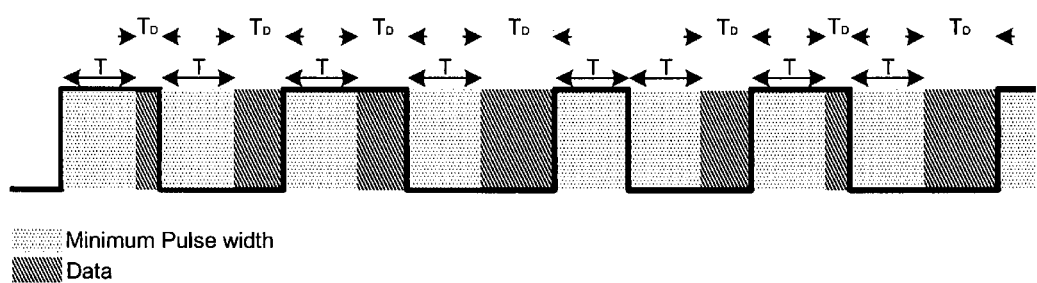
FIG. 2 is an exemplary representation of an output signal of an amplifier which employs a minimum pulse width enforcement mechanism.

FIG. 2 shows an exemplary differential output pulse train generated by a switching amplifier which employs a minimum pulse width enforcement mechanism, but does not enjoy the benefits of the present invention. As can be seen, the widths of positive and negative-going pulses vary and, as a result, so does the frequency of operation. Each pulse includes a portion of duration T which corresponds to the minimum pulse allowed. Pulses longer than the minimum pulse width (i.e., most pulses) also include an additional portion referred to as $T_D$. Because the minimum pulse width T is always included in each positive or negative going pulse, i.e., it is constant, this portion of the output signal actually contains no meaningful information. Only the portion of each pulse corresponding to $T_D$ contains the actual signal information or data. Thus, without benefits of the present invention in amplifiers which enforce a minimum pulse width, there can be significant amounts of power dissipated in the load which conveys no relevant information.

Figure 3:
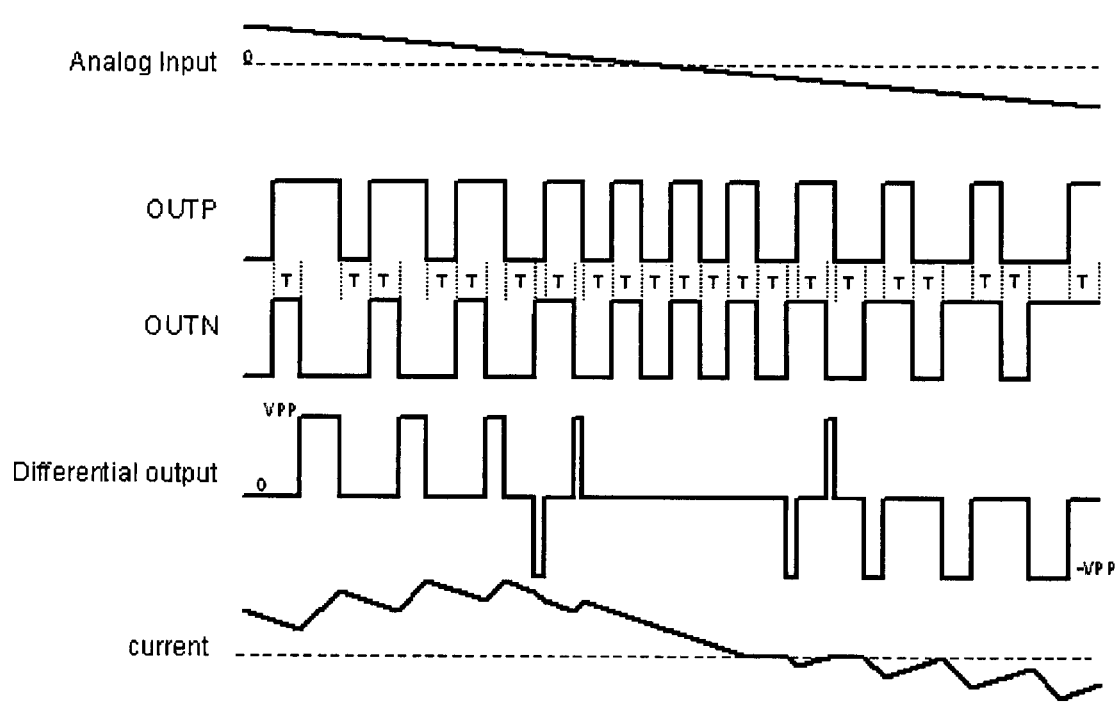
FIG. 3 shows five signal traces illustrating operation of an exemplary amplifier designed according to a specific embodiment of the invention.

FIG. 3 shows multiple signal traces illustrating operation of a switching amplifier implemented according to a specific embodiment of the invention (e.g., switching amplifier 100 of FIG. 1). In response to the Analog Input shown, the amplifier generates signals OUTP and OUTN on opposite sides of the load. The differential output across the load (OUTP-OUTN) and the corresponding load current are also shown.

Rather than generating signals Y and YB (and thus OUTP and OUTN) as complementary signals (and therefore generating a pulse train such as the one shown in FIG. 2), digital processing block 106 generates signals Y and YB such that OUTN is effectively inverted and delayed with respect to OUTP as shown in FIG. 3. The amount by which the inverted OUTN is delayed with respect to OUTP is T, i.e., the minimum pulse width enforced by digital processing block 106. When the signals OUTP and OUTN are applied differentially across load 116, the portion of each pulse containing no data (i.e., the enforced minimum pulse width) is effectively canceled, resulting in the power across the load substantially corresponding to the portion of each pulse containing meaningful data as shown in FIG. 3. As shown, the output current (shown below the differential output) tracks the Analog Input.

The significant reduction in power dissipated in the load enabled by various embodiments of the present invention allows designers to design architectures without the bulky and expensive output filtering which is often otherwise required. As will be understood, this is particularly advantageous for audio applications.

According to a specific embodiment, the amount by which one end of the differential output signal is delayed is maintained as close to the minimum allowable pulse width as practicable. This is because introducing a delay of more or less than the minimum allowable pulse width would result in cancellation of portions of pulses containing data. This, in turn, degrades the amplifier's signal-to-noise ratio. Put another way, the delay may only deviate from the minimum allowable pulse width for a particular application such that an acceptable signal-to-noise ratio is achieved.

The manner in which digital processing block 106 generates OUTN may vary according to different embodiments of the invention. For example, an inverter and a delay line of duration T (represented by block 126) may be employed to operate on OUTP to generate OUTN. Alternatively, and according to a specific embodiment of the invention, OUTN is generated with reference to OUTP using a one-shot circuit (also represented by block 126) which responds to each transition in OUTP by causing an opposite transition in OUTN after the desired delay, e.g., T. Regardless of how the signals are generated, the relationship between them may be understood with reference to the Differential output trace of FIG. 3. As shown, each time OUTP makes a transition, a transition of opposite polarity occurs in OUTN after a delay of T.

According to various embodiments, the power delivered to the load may be further reduced (and the possibility of inductorless operation further enhanced) by increasing the operating frequency of the amplifier. This may be achieved with higher clock frequencies, or alternatively, by decreasing the amplifier loop delay. According to a specific embodiment in which digital processing block includes a delay line for introducing loop delay for other purposes (e.g., decreasing the switching frequency or providing a well defined loop delay), the delay introduced by such a delay line may be reduced or eliminated for this purpose.

While the invention has been particularly shown and described with reference to specific embodiments thereof, it will be understood by those skilled in the art that changes in the form and details of the disclosed embodiments may be made without departing from the spirit or scope of the invention. For example, amplifier architectures do not necessarily have to be inductorless or eliminate all output filtering to be within the scope of the invention. That is, a switching architecture which employs the technique described herein may still include some form of output filtering (including the use of inductors) without departing from the scope of the invention.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A switching circuit, comprising:
   analog processing circuitry operable to receive an analog input signal and generate a processed analog signal;
   analog-to-digital conversion circuitry operable to convert the processed analog signal to a first digital signal;
   digital processing circuitry operable to convert the first digital signal to first and second power stage drive signals, the digital processing circuitry further being operable to enforce a minimum pulse width on the first and second power stage drive signals;

power stage circuitry operable drive a load differentially with first and second output signals in response to the power stage drive signals;

wherein the digital processing circuitry is operable to generate the first and second power stage drive signals such that the second output signal substantially corresponds to an inverted version of the first output signal delayed by a delay time substantially corresponding to the minimum pulse width.

2. The switching circuit of claim 1 wherein the analog processing circuitry comprises at least one integrator stage and the switching circuit further comprises continuous-time feedback circuitry from the power stage circuitry to the analog processing circuitry.

3. The switching circuit of claim 2 wherein the switching circuit comprises one of a sigma-delta modulator and a modified sigma-delta modulator.

4. The switching circuit of claim 1 wherein the digital processing circuitry comprises a one-shot circuit which is operable to generate the second power stage drive signal in response to the first power stage drive signal.

5. The switching circuit of claim 4 wherein the one-shot circuit is operable to maintain a current signal level of the second power stage drive signal for the delay time in response to each transition of the first power stage drive signal.

6. The switching circuit of claim 1 wherein differentially driving the load with the first and second output signals results in substantial cancellation of portions of the first and second output signals which correspond to the minimum pulse width.

7. The switching circuit of claim 1 wherein the power stage circuitry is operable to drive the load without an intervening output filter.

8. The switching circuit of claim 1 wherein the analog-to-digital conversion circuitry comprises a clocked comparator.

9. The switching circuit of claim 1 wherein the power switching stage comprises first and second output switches in a first bridge configuration operable to generate the first output signal, and third and fourth switches in a second bridge configuration operable to generate the second output signal.

10. The switching circuit of claim 1 wherein the switching circuit comprises one of a switching amplifier and a switching regulator.

11. The switching circuit of claim 1 wherein the switching circuit comprises an audio amplifier.

12. An electronic system comprising at least one of the switching circuit of claim 1.

13. A switching circuit comprising circuitry for generating first and second output signals for differentially driving a load, the circuitry being operable to enforce a minimum pulse width on each of the first and second output signals, the second output signal substantially corresponding to an inverted version of the first output signal delayed by a delay time substantially corresponding to the minimum pulse width.

14. The switching circuit of claim 13 wherein the switching circuit comprises one of a sigma-delta modulator and a modified sigma-delta modulator.

15. The switching circuit of claim 13 wherein the circuitry comprises a one-shot circuit which is operable to generate the second output signal in response to the first output signal.

16. The switching circuit of claim 15 wherein the one-shot circuit is operable to maintain a current signal level of the second output signal for the delay time in response to each transition of the first output signal.

17. The switching circuit of claim 13 wherein differentially driving the load with the first and second output signals results in substantial cancellation of portions of the first and second output signals which correspond to the minimum pulse width.

18. The switching circuit of claim 13 wherein the circuitry is operable to drive the load without an intervening output filter.

19. The switching circuit of claim 13 wherein the switching circuit comprises one of a switching amplifier and a switching regulator.

20. The switching circuit of claim 13 wherein the switching circuit comprises an audio amplifier.

21. An electronic system comprising at least one of the switching circuit of claim 13.

* * * * *